United States Patent [19]
Roeska et al.

[11] Patent Number: 4,960,489
[45] Date of Patent: Oct. 2, 1990

[54] METHOD FOR SELF-ALIGNED MANUFACTURE OF CONTACTS BETWEEN INTERCONNECTS CONTAINED IN WIRING LEVELS ARRANGED ABOVE ONE ANOTHER IN AN INTEGRATED CIRCUIT

[75] Inventors: Guenther Roeska, Holzkirchen; Josef Winnerl; Franz Neppl, both of Munich, all of Fed. Rep. of Germany

[73] Assignee: Siemens Aktiengesellschaft, Berlin and Munich, Fed. Rep. of Germany

[21] Appl. No.: 451,987

[22] Filed: Dec. 18, 1989

[30] Foreign Application Priority Data

Dec. 16, 1988 [EP] European Pat. Off. ............. 8812168

[51] Int. Cl.$^5$ .......................... B44C 1/22; C23F 1/02; C03C 15/00; C03C 25/06
[52] U.S. Cl. .................................. 156/652; 156/656; 156/659.1; 156/661.1; 357/67; 357/71; 437/189; 437/246
[58] Field of Search ............... 156/643, 644, 650, 652, 156/653, 655, 656, 657, 659.1, 661.1, 662; 357/65, 67, 71; 437/189, 190, 192, 193, 194, 195, 198, 199, 200, 228, 233, 235, 238, 245, 246

[56] References Cited

U.S. PATENT DOCUMENTS

| 4,541,893 | 9/1985 | Knight | 156/652 X |
| 4,614,021 | 9/1986 | Hulseweh | 29/590 |
| 4,650,543 | 3/1987 | Kishita et al. | 156/656 X |
| 4,740,485 | 4/1988 | Sharpe-Geisler | 156/652 X |
| 4,789,645 | 12/1988 | Calviello et al. | 156/656 X |

OTHER PUBLICATIONS

I. Ames et al., IBM J. Res. Develop., vol. 14, p. 461 (1970).
J. Electrochem. Soc., Solid-State Science and Technology, E. R. Sirkin et al., "A Method of Forming Contacts Between Two Conducting Layers Separated by a Dielectric", Jan., 1984, pp. 123-125.
1984 Proceedings First International IEEE VLSI Multilevel Interconnection Conference, R. E. Oaklay et al., "Pillars-The Way to Two Micron Pitch Multilevel Metallization", pp. 23-29.
IEDM 84, Stanford University Center for Integrated Systems, Donald S. Gardner et al., "Layered and Homogeneous Films of Aluminum and Aluminum/Silicon with Titanium, Zirconium, and Tungsten for Multilevel Interconnects", pp. 114-117.
1986 Proceedings Third International IEEE VLSI Multilevel Interconnection Conference, Jun., 1986, Michael T. Welch et al., "Pillar Interconnections for VLSI Technology", pp. 450-453.
International Student Edition, VLSI Technology, pp. 294-297.
IEDM 86—H. P. W. Hey et al., "Selective Tungsten on Aluminum for Improved VLSI Interconnects", pp. 50-53.
J. Electrochem. Society, Jul., 1987, R. H. Wilson et al., "Achieving Low Contact Resistance to Aluminum with Selective Tungsten Deposition", pp. 1867-1868.
Journal de Physique, E. Bertagnolli et al., "Nonselective W/WSi-CVD Technology for Low Resistance Via Plugs on Aluminum", Sep., 1988, pp. 179-182.

Primary Examiner—William A. Powell
Attorney, Agent, or Firm—Hill, Van Santen, Steadman & Simpson

[57] ABSTRACT

For self-aligned manufacture of contacts referred to as vias between interconnects that are contained in wiring levels arranged above one another in an integrated circuit, a pillar technique is employed where the contacts are produced before the deposition of an inter-metal dielectric to produce the pillar, a layer structure is produced that contains at least one metal layer for the lower wiring level and at least one conductive layer for the contacts. The longitudinal expanse of the contact is defined by a mask that reliably overlaps the desired width of the lower interconnect. The transversal expanse of the contact is defined by the mask needed for producing the lower interconnect. The contacts and the lower interconnects are produced by step-by-step etching.

10 Claims, 6 Drawing Sheets

METHOD FOR SELF-ALIGNED MANUFACTURE OF CONTACTS BETWEEN INTERCONNECTS CONTAINED IN WIRING LEVELS ARRANGED ABOVE ONE ANOTHER IN AN INTEGRATED CIRCUIT

BACKGROUND OF THE INVENTION

The invention is directed to a method for manufacturing contacts between interconnects contained in wiring levels arranged above one another in an integrated circuit.

In many families of integrated circuits, the linking of the individual elements or of entire modules of an integrated circuit occurs with a wiring on two or more levels. A separating insulation layer lies between these levels. The levels are connected via contacts through via holes in the separating insulation layer. These contacts are called vias.

Continuing miniaturization given a simultaneous increase of the current density in the metallic interconnects of integrated circuits requires vias that are largely filled with conductive material.

Various ways of producing via holes as well as filling these via holitle, R. H. Wilson et al, J. Electrochem. Soc.: Accelerated Brief Communication, page 1867 (July 1987); H. P. W. Hey et al Proc. IEDM, 3.2, page 50 (1986); E. R. Sirkin, I. A. Blech, J. Electrochem. Soc., Vol. 131, No. 1, p. 123 (1983), all incorporated herein by reference).

One way is to apply an insulation layer after the deposition and structuring of the lower metal layer, this insulation layer serving the purpose of separating the two wiring levels. This insulation layer is generally a plasma oxide layer that has a planarizing effect due to special methods. The planarizing is necessary in order to guarantee the necessary deactivation of the topology for the upper metal level. Via holes are produced in the insulation layer by reactive ion etching. The filling of the via holes occurs, for example, via a surface-wide tungsten deposition having a following etch-back step, or occurs with a selective tungsten deposition.

Such a method is disclosed in E. Bertagnolli et al, Journal de Physique, Vol. 49, C 4 (1988), pages 179 through 182, incorporated herein.

It is not assured in this method that the via holes through the conductive material will be completely filled. This can potentially lead to an undesired cross-sectional diminution of the interconnects. A mask that must be adjusted relative to a lower level is necessary for producing the via holes. The mask must be structured and adjusted such that a reliable overlap between interconnect and via hole, i.e. with the contact as well, is guaranteed. This overlap represents a considerable contribution to the size of the wiring grid in the lower metal level and therefore lowers the obtainable packing density.

Another way is what is referred to as the pillar technique which, for example, is described in E. R. Sirkin, I. A. Blech, J. Electrochem. Soc., Vol. 131, No. 1, page 123 (1983) incorporated herein by reference. The conductive material that is later intended to fill the vias is thus already deposited and structured before the insulation layer. This structuring occurs via a mask that corresponds to a complementary via mask. Subsequently, the insulation layer is deposited onto the surface and is etched back until the upper cover surfaces of the raised metal regions are exposed. The raised metal regions are referred to as pillars. This method assures a complete filling of the via holes. It is also assured that an adequate layer thickness above conductive layers lying therebelow is established at the edges of the insulation layers. The disadvantage of mask adjustment, however, remains.

SUMMARY OF THE INVENTION

It is an object of the present invention to provide a self-aligned method for manufacturing contacts, referred to as vias, between interconnects situated in wiring levels arranged above one another. This method allows a miniaturization of the pitch of the lower wiring level due to the omission of an overlap of the vias over the interconnects of the lower wiring level.

This object is achieved by the following steps:
(a) a layer structure is produced that contains at least a first conductive layer for the lower interconnect and at least one second conductive layer for the contact;
(b) the longitudinal expanse of the contact is defined by a mask that reliably overlaps the width of the lower interconnect;
(c) the transversal expanse of the contact is defined by the mask needed for generating the lower interconnects, and is defined before the lower interconnect is defined with the same mask; and
(d) the contact and the lower interconnect are produced by step-by-step etching.

Since the transversal expanse (i.e., the expanse perpendicular to the path of the interconnect) of the contact is defined before the definition of the lower interconnect with the same mask, a misalignment of the contact relative to the lower interconnect cannot occur. An overlap of the via with the lower interconnect can therefore be omitted. The contact arises in the form of a pillar, i.e. in the form of a raised region of conductive material, and arises in self-aligned fashion relative to the lower interconnect. A drastic reduction of the lower wiring grid is thus possible. Accordingly, the packing density of the integrated circuit is increased. A gain in area of about 30% can be achieved with this self-aligned method.

DESCRIPTION OF THE PREFERRED EMBODIMENTS

Figure 1:
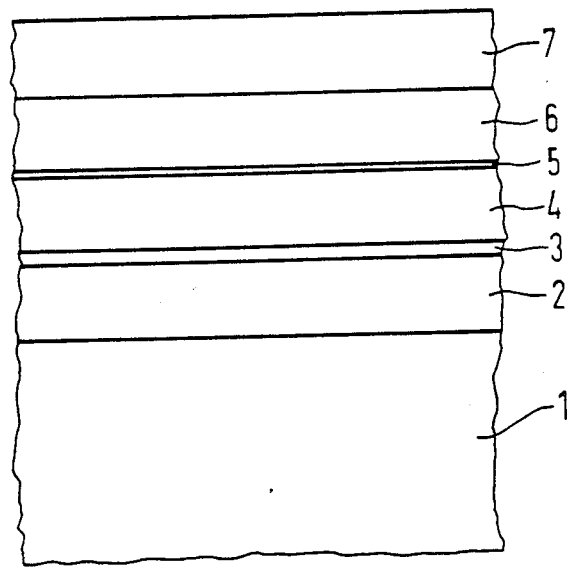
FIGS. 1-9 represent method steps for the manufacture of a contact, whereby the longitudinal expanse is defined first and the transversal expanse of the contact is defined thereafter.

The structure shown in FIG. 1 arises on the basis of the following method steps. An insulation layer 2 is applied onto a substrate 1. The substrate 1 is composed of mono-crystalline silicon. Active circuit elements, for example transistors, are contained in the substrate 1. Via holes are provided in the insulation layer 2 that, for example, is composed of $SiO_2$, and are provided where a connection to the active elements situated in the substrate 1 is produced. The active circuit elements and the via holes are not shown in the drawing FIGURES. A diffusion barrier layer 3 is deposited onto the insulation layer 2 and a first conductive layer 4 is deposited onto the diffusion barrier layer 3. The interconnects are formed later from the first conductive layer 4. The first conductive layer 4 is manufactured, for example, of a material on the basis of aluminum. For example, it is formed of AlSiTi whose suitability as an interconnect material is disclosed by European patent No. 0,110,401 incorporated herein. Alternatively, it is formed of AlSiCu, which is known from I. Ames et al, IBM J. Res. Develop., Vol. 14, page 461 (1970) incorporated herein. And in another alternative, it may be formed of a multi-layer system based on aluminum as disclosed by D. S. Gardner et al, page 114 (1984), incorporated herein. It is possible to produce the first conductive layer 4 of some other conductive material such as, for example, a metal silicide or doped polysilicon or of other metals such as for example tungsten, when the specific circuit makes this necessary.

The silicon is dissolved in the aluminum at the boundary surface between the aluminum and the mono-silicon, and a migration of the aluminum into the silicon substrate occurs. Aluminum spikes are thus formed in the substrate that can lead to substrate shorts. In order to avoid this effect in the region of via holes, the diffusion barrier layer 3 is provided between the insulation layer 2 and the first conductive layer 4. The diffusion barrier layer 3 is formed, for example, of Ti/TiN. The diffusion barrier layer 3 can be omitted when this effect does not jeopardize the function of the circuits, or when a metal-to-monosilicon boundary surface is not present (for example, further metal levels).

A second conductive layer 5 is deposited onto the first conductive layer 4. The second conductive layer 5 is significantly thinner than the first conductive layer 4. A third conductive layer 6 is deposited onto the second conductive layer 5. The third conductive layer 6 is formed of a highly conductive material that can be selected identical to the material of the first conductive layer 4. The contacts in the form of pillars are formed from the third conductive layer 6. The third conductive layer 6 must therefore be deposited in a thickness that corresponds to the desired height of the pillar. The second conductive layer 5 is composed of a material that is selected relative to the material of the third conductive layer 6 such that a high selectivity compared to the second conductive layer 5 is present when etching the third conductive layer 6. The second conductive layer 5 therefore acts as an etching stop when etching the third conductive layer 6. A first photoresist structure 7 is applied onto the second conductive layer 6 with the assistance of a photolithography.

The photoresist structure 7 is shaped such that it reliably overlaps in width the region in which the interconnect is later formed from the first conductive layer 4, and such that the desired length of the conductive connection is defined in the longitudinal direction of the interconnect to be formed later. Subsequently, the exposed parts of the third conductive layer 6 are etched away down to the second conductive layer 5 that acts as an etching stop. The resulting structure is shown in FIG. 2.

Figure 2:
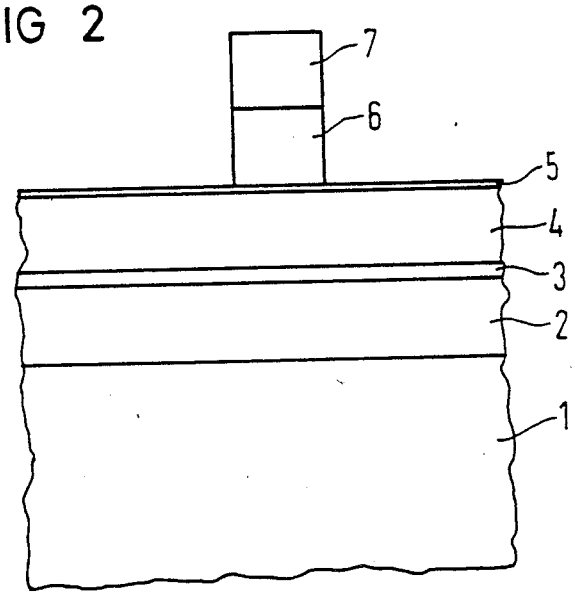
Figure 3:
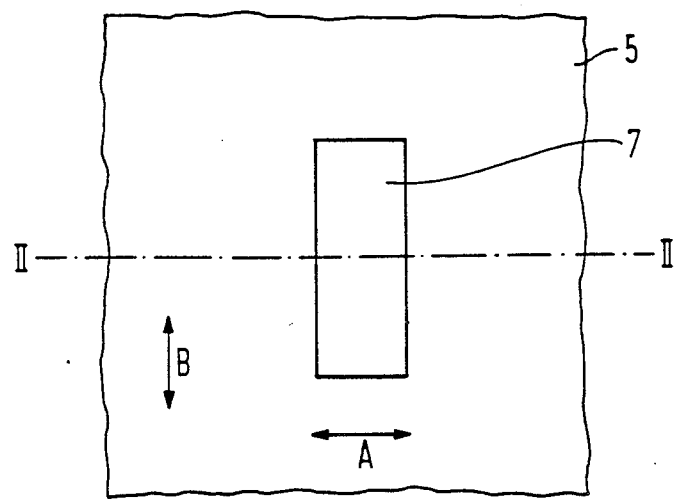

FIG. 3 shows a plan view onto the structure illustrated in FIG. 2. The third conductive layer 6 is etched off outside of the first photoresist structure 7, and the second conductive layer 5 is exposed. II-II references the section shown in FIG. 2. The double arrow A indicates the direction parallel to the longitudinal direction of the interconnect to be later formed, and the double arrow B indicates the direction perpendicular to the longitudinal direction of the interconnect to be later formed.

Figure 4:
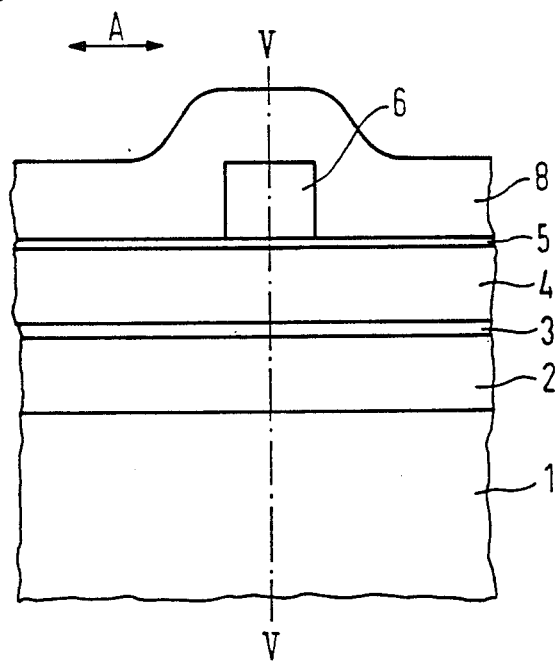

As shown in FIG. 4, the structure is provided with a second photoresist structure 8 after the removal of the first photoresist structure 7. The second photoresist structure 8 is designed such that it is suitable for structuring the interconnect that is subsequently formed from the first conductive layer 4.

Figure 5:
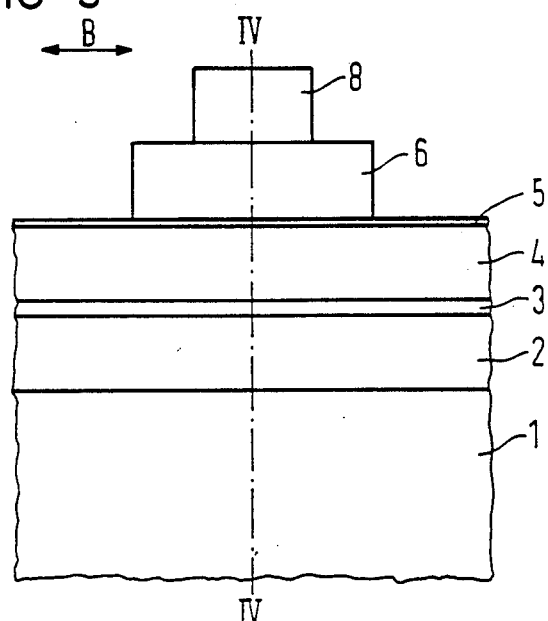

The section referenced V—V in FIG. 4 is shown in FIG. 5. It may be seen that the second photoresist structure 8 is narrower than the third conductive layer in this view. The third conductive layer 6 had been structured in the first etching step such that it reliably overlaps the width of the interconnect to be formed later.

The section shown in FIG. 4 is referenced IV—IV.

Figure 6:
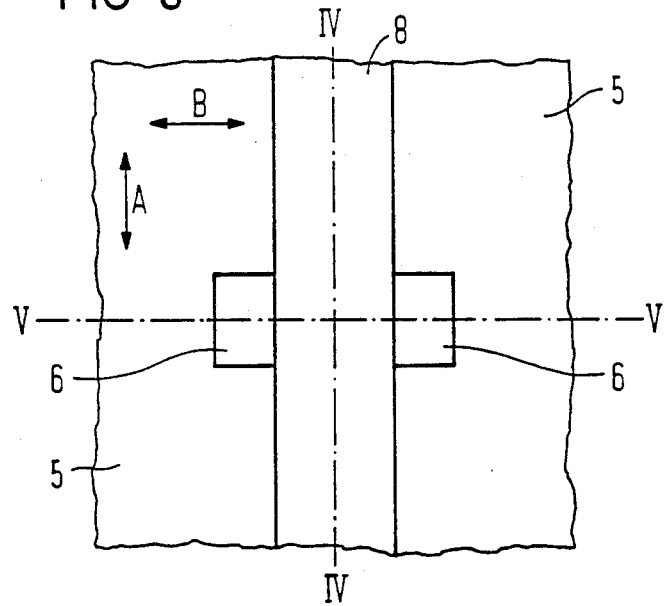

FIG. 6 shows the plan view of this structure. The second photoresist structure 8 proceeds over the third conductive layer 6 and has the structure of the interconnect to be formed later. In width, the third conductive layer 6 noticeably projects beyond the second photoresist structure 8. The length of the third conductive layer 6 is defined by the preceding etching step. IV—IV indicates the section shown in FIG. 4 and V—V indicates the section shown in FIG. 5.

The lithography step for structuring the second photoresist structure 8 in the shape of the interconnect to be formed later must be able to handle the height difference in the region of the third conductive layer 6 (see FIG. 4). Problems in the exposure (depth of field) and in the resist technique can occur here dependent on the thickness of the third conductive layer 6, i.e. dependent on the desired height of the pillar. These problems can be avoided by switching from the conventional single-layer resist technique to a multi-layer resist technique.

In the next step, those regions of the third conductive layer 6 that were protected by the first photoresist structure 7 and that are not covered by the second photoresist structure 8 are etched away (see FIG. 5 and FIG. 6). As a result, the third conductive layer 6 is also defined in the direction (indicated by the double arrow B) transverse relative to the second photoresist structure 8. The etching of the third conductive layer 6 again occurs down to the second conductive layer 5 that acts as an etching stop. That part of the surface not covered by the second photoresist structure 8 is protected by the second conductive layer 5 during the etching. The pillars are completely produced after this step.

The interconnect is then structured, with the second photoresist structure 8 acting as a mask. For that purpose, the second conductive layer 5 must first be etched off. The first layer 4 is then etched off. It is advantageous to select the material of the first layer 4 relative to the material of the diffusion barrier layer 3 lying therebelow such that the diffusion barrier layer 3 forms an etching stop when etching the first conductive layer 4 since this etching must be greatly over-drawn. Due to an over-drawing of the etching of the first conductive layer 4, metal residues that are potentially present, particularly between two pillars, are eliminated. These are undesirable because of the increased aspect ratio. The diffusion barrier layer 3 is subsequently etched off down to the insulation layer 2.

Figure 7:
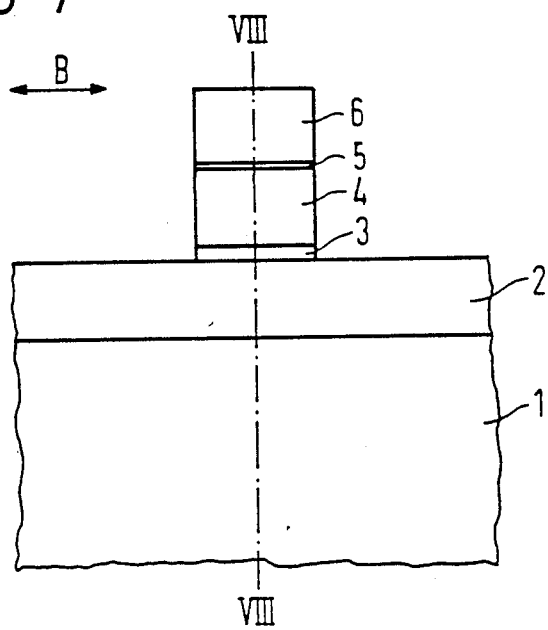
Figure 8:
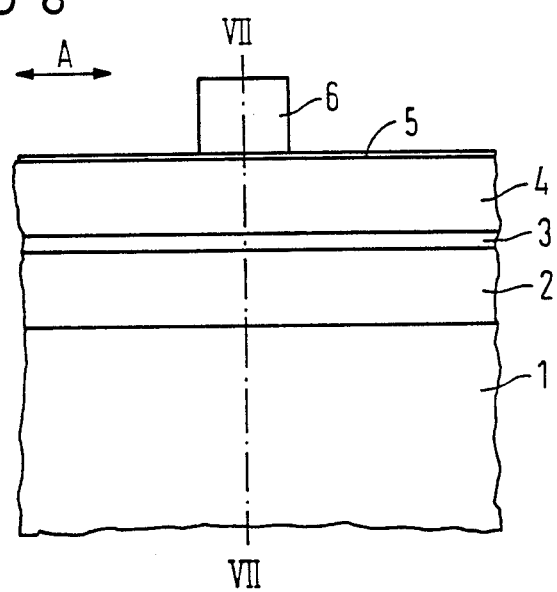

The structure deriving after the removal of the second photoresist structure 8 is shown in FIG. 7. The section referenced VIII—VIII in FIG. 7 is shown in FIG. 8. It may be seen in FIG. 7 that the third conductive layer 6 is arranged in self-aligned fashion over the first conductive layer 4. The width of the pillar formed from the third conductive layer 6 is the same as that of the interconnect formed from the first conductive layer 4 as a result of the manufacturing procedure. The section shown in FIG. 7 is referenced VII—VII in FIG. 8.

It may be seen in the view shown in FIG. 8 that the pillar formed of the third conductive layer 6 is limited in the longitudinal direction (double arrow A) by the interconnect formed from the first conductive layer 4. The surface of the interconnect formed from the first conductive layer 4 remains covered by the second conductive layer 5. During tempering, the first conductive layer 5 protects the exposed surface of the interconnect formed from the first conductive layer 4 against what is referred to as a vertical hillock formation. What are meant by "hillocks" are agglomerations of material at the metallized regions (vertical hillocks) or at the etched sidewalls (lateral hillocks). Hillocks can arise in tempering processes, but also can arise under current loads. The second conductive layer 5 therefore acts as a protection against vertical hillock growth on the interconnect formed from the first conductive layer 4. By contrast, such a covering layer can promote lateral hillock growth.

Figure 9:
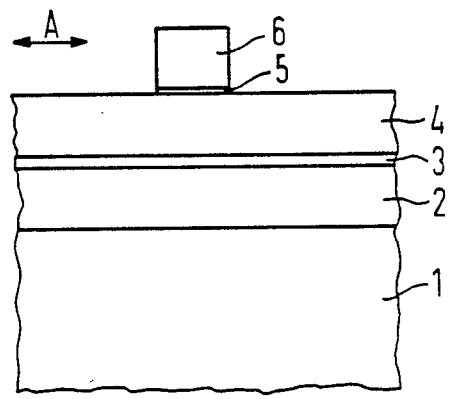

If, due to the material employed or due to the process management, the interconnect formed of the first conductive layer 4 tends toward lateral hillock formation, the second conductive layer 5 must be removed outside of the pillar formed from the third conductive layer 6. For example, this can occur before the removal of the second photoresist structure 8. The structure then resulting is shown in FIG. 9.

When the diffusion barrier layer 3 and the second conductive layer 5 are etchable in the same process, the second photoresist structure 8 is removed before the structuring of the diffusion barrier layer 3. The uppermost part of the third conductive layer 6, the exposed second conductive layer 5, as well as the exposed diffusion barrier layer 3 are then etched off in a single, surface-wide etching step. If no diffusion barrier layer 3 is provided, an etching process should be employed that has high selectivity to the insulation layer 2 lying therebelow.

A further exemplary embodiment shall be set forth below with reference to FIGS. 10–13.

Figure 10:
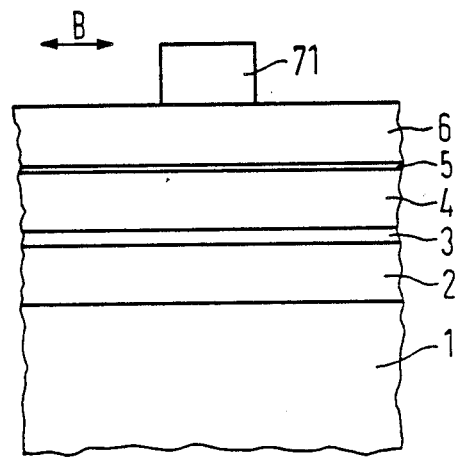
FIGS. 10-13 show manufacturing steps for a contact, whereby the transversal expanse is defined first, which is then followed by the definition of the longitudinal expanse.

FIG. 10 shows the layer structure comprising the substrate 1, the insulation layer 2, the diffusion barrier layer 3, the first conductive layer 4, the second conductive layer 5, and the third conductive layer 6, whose manufacture was set forth in conjunction with FIG. 1. A first photoresist mask 71 is produced on the third conductive layer 6.

Figure 11:
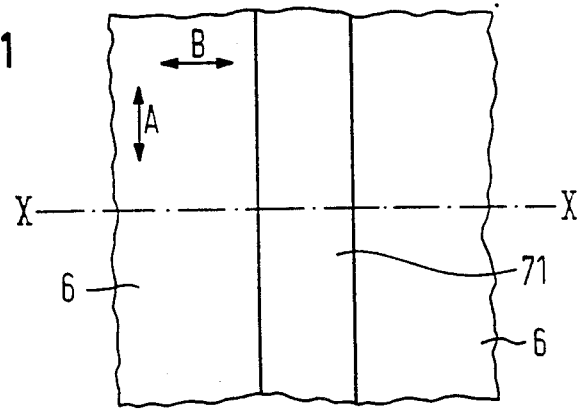

FIG. 11 shows a plan view of the structure from FIG. 10. X—X references the section shown in FIG. 10. It may be seen that the first photoresist mask 71 is structured such that it defines the path of the interconnect that is later formed from the first conductive layer 4. The third conductive layer 6, the second conductive layer 5, the first conductive layer 4, and, if present, the diffusion barrier layer 3 are successively etched away in accordance with the first photoresist mask 71. The interconnect is thereby formed from the first conductive layer 4. The second conductive layer 6 from which the pillar is formed is given the same width in this etching step as the interconnect formed from the first conductive layer 4. It is given this width due to the manufacturing process. The second conductive layer 6 is arranged in self-aligned fashion over the interconnect formed from the first conductive layer 4.

Figure 12:
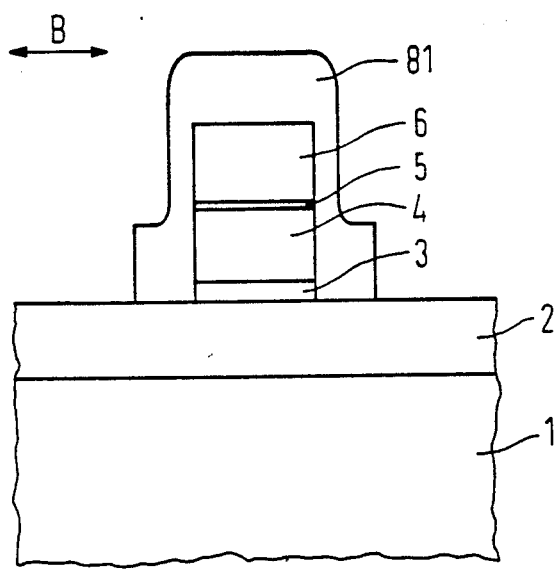

FIG. 12 shows the structure resulting after the removal of the first photoresist mask 71 and after the application of a second photoresist mask 81. The second photoresist mask 81 reliably overlaps in width the diffusion barrier layer 3, the first conductive layer 4, the second conductive layer 5, and the third conductive layer 6, which are all structured in accordance with the interconnect. The depth of field problems set forth in conjunction with FIG. 5 are not relevant in the lithography step for producing the second photoresist mask 81 since only the third conductive layer 6 must be structured in this process cycle. This is the main difference between the two embodiments.

Figure 13:
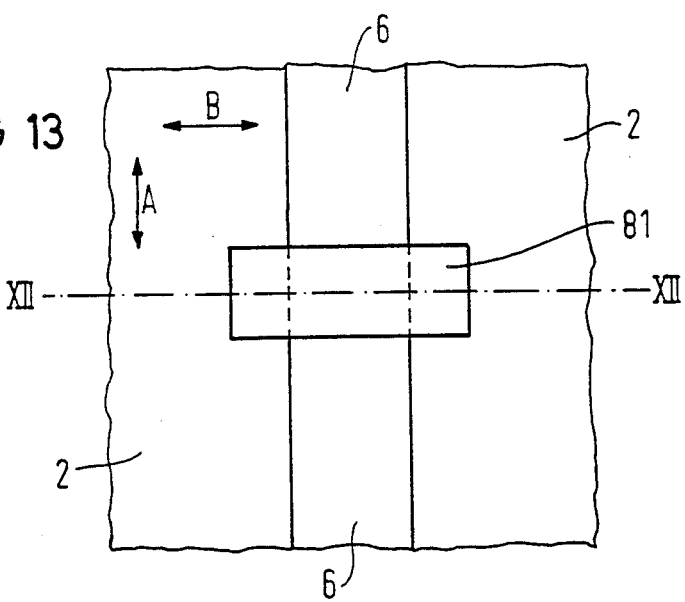

FIG. 13 shows a plan view onto the structure of FIG. 12. XII—XII references the section shown in FIG. 12. It may be seen that the second photoresist mask 81 reliably overlaps in width the third conductive layer 6 structured in accordance with the interconnect. In length, the second photoresist mask 81 defines the expanse of the pillar to be produced. In the next step, the exposed regions of the third conductive layer 6 are etched away down to the first conductive layer 5, which again acts as an etching stop. The pillar formed from the third conductive layer 6 is arranged in self-aligned fashion above the interconnect formed from the first conductive layer 4, and is conductively connected thereto via the second conductive layer 5.

If the second conductive layer 5 is desired as a cover layer for protection against vertical hillock formation, then the second photoresist mask 81 is immediately removed, whereby the structure shown in FIG. 8 results. If the second conductive layer 5 is not desired to be a cover layer for protection against vertical hillock formation, then the exposed regions of the second conductive layer 5 are etched away down to the first conductive layer 4 and the photoresist mask 81 is then removed, whereby the structure shown in FIG. 9 derives.

The surface is provided with an insulation layer (not shown) that is etched away above the pillar down to the pillar. It is provided in a known fashion (see, for example E. R. Sirkin, I. A. Blech, J. Electrochem. Soc., Vol. 131, No. 1, page 123 (1983), incorporated herein by reference).

Both embodiments of the method of the invention contain self-aligned, completely filled via holes, whereby a hillock-inhibiting cover layer can be utilized as an option. The same set of masks (in different sequences) can be used for both embodiments. The pitch of the lower wiring level is reduced by the overlap between the interconnect and the via.

The two alternative embodiments differ in terms of their demands made of the photolithography, of the resist technique, as well as of the etching technique. One of the two methods proves more advantageous, dependent upon application. The alternative set forth first is better-suited for rather shallow vias and thicker interconnects. In contrast, the second alternative set forth above is particularly suited for vias that must be able to handle a great height difference.

Although various minor changes and modifications might be proposed by those skilled in the art, it will be understood that we wish to include within the claims of the patent warranted hereon all such changes and modifications as reasonably come within our contribution to the art.

What we claim is:

1. A method for manufacturing a contact between interconnects contained in wiring levels arranged above one another in an integrated circuit, comprising steps of:
providing a layer structure that contains at least a first conductive layer for a lower interconnect to be later formed, and at least one further conductive layer for the contact;
etching a longitudinal expanse of the contact by use of a mask such that portions of the longitudinal expanse overlap a given width of the lower interconnect to be later formed;
etching a lateral expanse of the contact by use of another mask used for later forming the lower interconnect, the lateral expanse of the contact being etched before the lower interconnect is formed with said another mask; and
etching the lower interconnect.

2. A method for manufacturing a contact between interconnects contained in wiring levels arranged above one another in an integrated circuit, comprising steps of:
applying a first conductive layer for a lower wiring level interconnect to be later formed onto a monocrystalline silicon substrate provided with an insulating layer;
providing a second conductive layer which is thinner than the first conductive layer and depositing the second conductive layer onto the first conductive layer;
providing a third conductive layer having a thickness desired for the contact and depositing the third conductive layer onto the second conductive layer, a material of the second conductive layer being selected relative to the material of the third conductive layer such that the second conductive layer acts as an etching stop when etching the third conductive layer;
applying a first photoresist layer onto the third conductive layer and structuring it for use as a mask such that it overlaps a given desired width of the lower interconnect to be formed later in the first conductive layer and such that it defines a desired length of the contact in a direction of the longitudinal expanse;
etching off exposed parts of the third conductive layer down to the second conductive layer;
applying a second photoresist after removal of the first photoresist layer;
structuring the second photoresist layer for use as a mask by employing photolithography for defining the lower interconnect;
etching off exposed parts of the third conductive layer down to the second conductive layer;
etching off exposed parts of the second conductive layer down to the first conductive layer;
producing the lower interconnect by etching off exposed parts of the first conductive layer; and
removing residues of the second photoresist layer.

3. A method according to claim 2 including the steps of applying a conductive diffusion barrier layer onto the insulation layer before the application of the first conductive layer; and etching off exposed regions of the diffusion barrier layer down to the insulation layer before removal of the second photoresist layer.

4. A method according to claim 2 including the step of employing a layer formed of a plurality of layers as said second photoresist layer.

5. A method according to claim 2 including the step of etching off the second conductive layer on the lower interconnect outside of the contact.

6. A method according to claim 2 wherein said step of etching off exposed parts of the second conductive layer down to the first conductive layer occurs before said step of removal of the first photoresist layer.

7. A method for manufacturing a contact between interconnects contained in wiring levels arranged above one another in an integrated circuit, comprising steps of:
applying the first conductive layer for a lower wiring level interconnect onto a monocrystalline silicon substrate provided with an insulation layer;
providing a second conductive layer thinner than the first conductive layer and depositing it onto the first conductive layer;
providing a third conductive layer having a desired thickness of the contact and depositing said third layer onto the second conductive layer, a material of the second conductive layer being selected relative to the material of the third conductive layer such that the second conductive layer acts as an etching stop when etching the third conductive layer;
producing a first photoresist mask on the third conductive layer, said first photoresist mask being structured such that it defines the lower interconnect;
successively etching off the third conductive layer, the second conductive layer, and the first conductive layer in conformance with the first photoresist mask;
removing the first photoresist mask and then providing a second photoresist mask, said second photoresist mask being structured such that it reliably overlaps a width of the lower interconnect and such that it defines a desired length of the contact in a direction of a longitudinal expanse thereof;
producing said contact by etching the third conductive layer off down to the second conductive layer; and
removing the second photoresist mask.

8. A method according to claim 7 including the steps of applying a conductive diffusion barrier layer onto the insulation layer before the first conductive layer; and etching off exposed regions of the diffusion barrier layer down to the insulation layer before the step of removing the first photoresist mask.

9. A method according to claim 7 including the step of etching off the second conductive layer down to the first conductive layer before the step of removing the second photoresist mask.

10. A method according to claim 7 including the step of etching off the second conductive layer on the lower interconnect outside of the contact.

* * * * *